United States Patent
Yu et al.

(10) Patent No.: US 6,281,555 B1
(45) Date of Patent: Aug. 28, 2001

(54) INTEGRATED CIRCUIT HAVING ISOLATION STRUCTURES

(75) Inventors: Bin Yu, Fremont; Ming-Ren Lin, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,861

(22) Filed: Nov. 6, 1998

(51) Int. Cl.[7] ................................................. H01K 29/76
(52) U.S. Cl. ...................... 257/374; 257/368; 257/369; 257/374; 438/199; 438/201; 438/283
(58) Field of Search ...................... 257/368, 369, 257/374; 438/201, 203, 199

(56) References Cited

U.S. PATENT DOCUMENTS

| | | | |
|---|---|---|---|
| 4,092,660 | * 5/1978 | Blocker, III | 357/22 |
| 4,779,127 | * 10/1988 | Honjo | 357/41 |
| 5,072,267 | * 12/1991 | Hattori | 357/23.4 |
| 5,166,768 | * 11/1992 | Ito | 257/523 |
| 5,223,724 | * 6/1993 | Green, Jr. | 257/194 |
| 5,252,843 | * 10/1993 | Suzuki | 257/284 |
| 5,329,138 | * 7/1994 | Mitani et al. | 257/42 |
| 5,654,570 | * 8/1997 | Agnello | 257/338 |
| 5,663,092 | 9/1997 | Lee | 438/253 |
| 5,677,224 | * 10/1997 | Kadosh et al. | 437/57 |
| 5,726,084 | 3/1998 | Boyd et al. | 438/239 |
| 5,760,451 | 6/1998 | Yu | 257/382 |
| 5,773,871 | 6/1998 | Boyd et al. | 257/532 |
| 5,780,899 | * 7/1998 | Hu et al. | 257/335 |
| 5,854,503 | * 12/1998 | Hsueh et al. | 257/347 |
| 5,895,253 | * 4/1999 | Akram | 438/424 |
| 5,914,523 | * 6/1999 | Bashir et al. | 257/520 |
| 6,097,076 | * 8/2000 | Gonzalez et al. | 257/513 |
| 6,107,128 | * 8/2000 | Ishii et al. | 438/225 |

FOREIGN PATENT DOCUMENTS

| | | | |
|---|---|---|---|
| 360132343 | * 12/1998 | (JP) | 257/374 |
| 363304661 | * 12/1998 | (JP) | 257/374 |

* cited by examiner

*Primary Examiner*—Eddie Lee
*Assistant Examiner*—Edgardo Ortiz
(74) *Attorney, Agent, or Firm*—Foley & Lardner

(57) ABSTRACT

An integrated circuit is provided having an improved packing density due to an improved isolation structure between a plurality of devices on the substrate. An ultra shallow trench isolation structure is provided, typically having a trench depth just deeper than the doped regions of a transistor or other device placed thereon, but substantially shallower than the depth of a well associated with the transistor. A nitrogen ion implantation step is utilized to fabricate an implanted portion beneath the insulative portion, the implanted portion extending preferably below the depth of the well. Due to a shallower trench isolation structure, the structure may also be narrower, providing for improved packing density in a semiconductor device.

23 Claims, 1 Drawing Sheet

INTEGRATED CIRCUIT HAVING ISOLATION STRUCTURES

FIELD OF THE INVENTION

The present invention relates generally to an integrated circuit having isolation structures and more specifically to an integrated circuit having very shallow trench isolation structures to improve packing density.

BACKGROUND OF THE INVENTION

Electrical isolation of devices on an integrated circuit (IC), such as, transistors disposed on a semiconductor substrate, is critical to the proper functioning of the IC. Current leakage from one device to another, i.e. across the isolation region between the devices, is a persistent problem as ICs become increasingly smaller. Current leakage may occur, e.g., between the drain of one transistor and the source of another in N-channel metal oxide semiconductors (NMOS) or P-channel metal oxide semiconductors (PMOS), or between two sources or two drains in complementary metal oxide semiconductors (CMOS). Problems resulting from current leakage include affecting the state (ON or OFF) of a transistor, causing undesirable DC power dissipation, noise-margin degradation and voltage shift on dynamic nodes. Also, current leakage in the isolation region can escalate latchup, a form of isolation breakdown between the power and ground rails in CMOS and bipolar CMOS (BiCMOS) ICs, typically resulting in permanent circuit failure.

Various isolation technologies have been developed, dating back to the 1960s. One method is Local Oxidation of Silicon (LOCOS) isolation. LOCOS includes growing an oxide barrier from an oxide layer applied beneath a nitride layer over silicon. LOCOS isolation, however, is inadequate for submicron MOSFETs because of the relatively large size of the LOCOS structure. Polybuffered LOCOS (PBL) and shallow-trench refill isolation (STI) are more commonly employed in higher-count devices. PBL includes depositing a polysilicon layer over the pad oxide layer, then applying the nitride layer. The addition of the polysilicon layer provides stress relief during oxide growth to reduce undesirable effects such as "bird's beak."

Conventional STI processes typically include first etching a relatively shallow trench in the silicon substrate (i.e. 0.3–0.5 microns deep) between two devices, and then refilling the trench with an insulative material. The insulative material is selectively etched so that the insulative material remains in the trench. The insulative material serves to limit the flow of current between the doped regions of adjacent devices on the substrate and inhibits the formation of a parasitic transistor.

When the circuit size scales down even further to the ultra-large scale integrated (ULSI) circuit level, poly-buffered LOCOS and conventional STI processes become inadequate. Conventional STI processes require a certain trench depth to achieve sufficient electrical isolation to prevent the above-stated problems. However, conventional plasma etching processes are limited in that the aspect ratio (width/depth) cannot be scaled down aggressively due to limitations in the etching chemistry. Typically, the aspect ratio cannot exceed 1:5 units of width:depth of the trench. Thus, if the ratio of width to depth of the isolation structure cannot be increased due to limitations of conventional etching processes, and the depth of the trench must be at least 0.3 microns deep to adequately reduce leakage, then the width of the trench cannot be reduced under conventional processes to any narrower than about 0.06 microns. Consequently, the packing density of the IC is severely limited by conventional STI processes.

Thus, there is a need for an IC having isolation structures and an improved method of making such an integrated circuit that has very shallow trench isolation structures to facilitate increased packing density of devices on the IC while still maintaining adequate electrical isolation between the devices. Further, there is a need to increase the isolation ability of trench isolation structures without increasing the width of the structures.

SUMMARY OF THE INVENTION

These and other limitations of the prior art are addressed by the present invention which is directed to an integrated circuit having an improved packing density. According to an exemplary embodiment, an integrated circuit is provided on a substrate, the integrated circuit having a plurality of devices on the substrate, each device having a well region and a depth associated therewith. The substrate has a trench structure between two of the devices, the structure having an insulative material portion and an implanted material portion.

The present invention further relates to the above-mentioned integrated circuit, wherein the insulative portion of the trench structure has a depth smaller than the depth of the well regions of the adjacent devices.

According to another exemplary embodiment of the present invention, a shallow trench isolation structure is provided between two devices on an integrated circuit, the structure including an insulative material between the two devices and an implantation region adjacent to the insulative material. The insulative material has a depth smaller than the depth of wells associated with the two devices. The implantation region extends below the depth of the wells associated with the two devices.

According to yet another embodiment of the present invention, an integrated circuit is provided having electrical isolation between a plurality of devices on a substrate, each device having a well region, the well regions having a depth, the integrated circuit being prepared by a process. The process includes applying a layer of resist to the substrate, the resist layer having an aperture at a selected location between the devices; forming a trench in the substrate at the selected location, the trench having a depth smaller than the depth of the well regions of the devices; implanting a material at the selected locations; and providing an insulative material at the selected locations, whereby electrical isolation between the devices is provided.

BRIEF DESCRIPTION OF THE DRAWINGS

The present invention will hereafter be described with reference to the accompanying drawings, wherein like numerals denote like elements and.

DETAILED DESCRIPTION OF THE PREFERRED EMBODIMENTS

Figure 1:
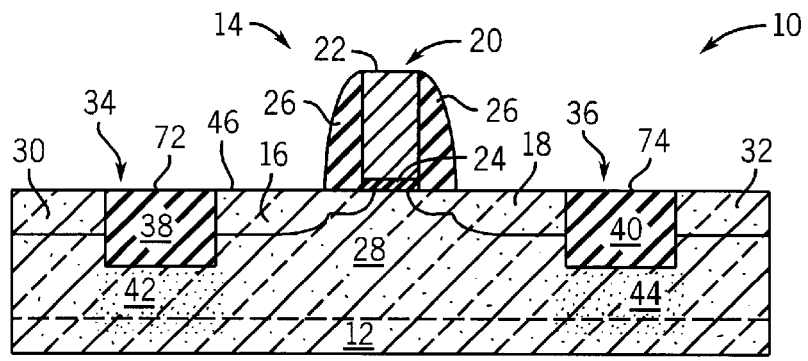
FIG. 1 is a cross-sectional view of a portion of a semiconductor substrate having a shallow trench isolation structure in accordance with an exemplary embodiment of the present invention.

Referring first to FIG. 1, there is shown a cross-sectional view of a portion of a semiconductor substrate having a shallow trench isolation structure in accordance with an exemplary embodiment of the present invention. A portion 10 of a semiconductor substrate 12 has a device 14 fabricated thereon. In this exemplary embodiment, device 14 is a metal oxide semiconductor field effect transistor (MOSFET), but may also be any other device suitable for placement on substrate 12 which requires electrical isolation from other devices on substrate 12, such as microsensors, microactuators, and other microstructures. Device 14 may be fabricated according to any of a number of known fabrication techniques, e.g. a complementary metal oxide semiconductor (CMOS) process. Substrate 12 preferably comprises silicon, and may also comprise gallium arsenide or other semiconductive materials.

Device 14 includes doped regions 16 and 18 which may act as a source and a drain, respectively, for device 14. Device 14 further includes a gate stack 20 including a conductive portion 22, preferably comprising polysilicon, and an insulative portion 24, preferably comprising oxide. Gate stack 20 may also further include sidewall spacers 26 to provide isolation between gate stack 20 and neighboring layers of fabrication materials. Between doped regions 16 and 18 lies a portion of substrate 12 comprising a well region 28. In this exemplary embodiment, well region 28 is a lightly doped region of substrate 12 and may extend, e.g. about 0.2 to 0.25 microns below the surface of substrate 12. Adjacent to device 14 are doped regions 30 and 32 of neighboring devices (not shown). Well region 28 can be a P-type or an N-type region.

Isolation structures 34 and 36 provide electrical isolation between doped region 30 and doped region 16 and between doped region 32 and doped region 18. Isolation structures 34, 36 include insulative portions 38, 40 and implanted portions 42, 44. Insulative portions 38, 40 extend preferably from an upper surface 46 of doped regions 16, 18 of substrate 12 to a depth below doped regions 16, 18 and may also extend, e.g. about one-half to as little as one-third of the depth of well region 28. Insulative portions 38, 40 provide electrical isolation between doped regions 16, 18 and doped regions 30, 32. Implanted portions 42, 44 (indicated by the double cross-hatch pattern in FIG. 1) are portions of substrate 12 having inert ions, e.g., nitrogen, oxygen, xenon, etc., implanted therein. Implanted portions 42, 44 serve to augment or supplement the electrical isolation provided by insulative portions 38, 40. In this exemplary embodiment, implanted portions 42, 44 extend from the bottom surface of insulative portions 38, 40 to a depth below well region 28. Accordingly, latch-up is suppressed by isolation structures 34, 36.

Figure 2:
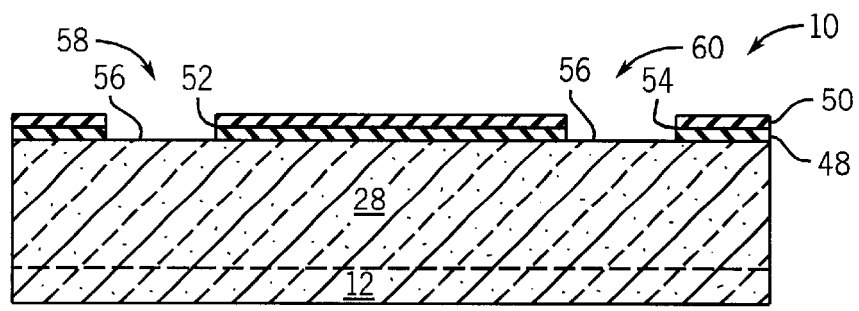
FIG. 2 is a cross-sectional view of the portion of the semiconductor substrate illustrated in FIG. 1 showing a photoresist application step.
Figure 3:
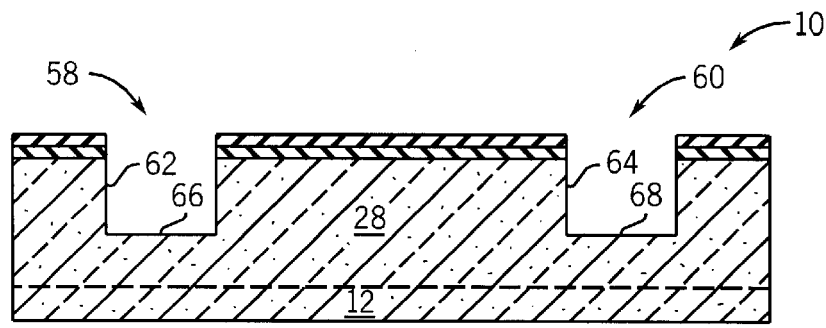
FIG. 3 is a cross-sectional view of the portion illustrated in FIG. 1 showing a trench etching step.
Figure 4:
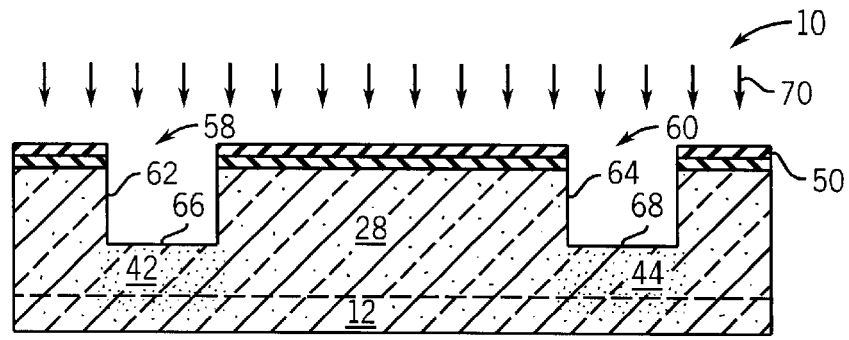
FIG. 4 is a cross-sectional view of the portion illustrated in FIG. 1 showing a material implantation step.

With reference to FIGS. 2–4, the method of fabricating portion 10 of substrate 12 will be described. Referring first to FIG. 2, FIG. 2 is a cross-sectional view of portion 10 of substrate 12 showing a photoresist application step. Typically, substrate 12 is lightly doped to form well region 28, the dopants having the opposite type (P-type or N-type) of substrate 12. An insulative layer 48, preferably containing an oxide material, e.g. $SiO_2$, is applied over substrate 12. Layer 48 may be grown in a conventional thermal process, or applied by a chemical vapor deposition (CVD) or a physical vapor deposition (PVD) process. Subsequently, a barrier layer 50, preferably a nitride layer, e.g. $Si_3N_4$, is applied over insulative layer 48. Using a standard photo lithography process, apertures 52, 54 are formed in layers 48 and 50 at selected locations 58, 60, thereby exposing upper surface 56 of substrate 12 at the selected locations.

Referring now to FIG. 3, FIG. 3 is a cross-sectional view of portion 10 showing a trench etching step. At selected locations 58, 60, a conventional trench etching process, such as a dry or plasma etch, is utilized to etch trenches 62, 64 in substrate 12. Trenches 62, 64 are etched to bottom surfaces 66, 68 which extend to a depth somewhat shallower than conventional shallow trench isolation structures, making them very shallow or "ultra" shallow. For example, bottom surfaces 66, 68 of trenches 62, 64 may extend less than 0.1 microns into substrate 12. Bottom surfaces 66, 68 of trenches 62, 64 may extend one-half to one-third the depth of well region 28. Thus, for a well region 28 depth of 0.2 to 0.25 microns, bottom surfaces 66, 68 may be as shallow as about 0.06 microns or less. By reducing the depth of trenches 62, 64, the present invention allows the widths of trenches 62, 64 to also be reduced. Due to limitations in known etching techniques, the aspect ratio, i.e. width/depth, of trenches 62, 64 cannot be reduced beyond a given ratio. Thus, a reduction in the depth of trenches 62, 64 according to the present invention allows device 14 to be placed closer to neighboring devices. Bottom surfaces 66, 68 of trenches 62, 64 preferably extend below subsequently implanted doped regions 16, 18 and also preferably extend substantially shallower than subsequently fabricated well region 28 (See FIG. 1).

Referring now to FIG. 4, FIG. 4 is a cross-sectional view of portion showing a material implantation step. Arrows 70 indicate implantation of a material, preferably inert ions, e.g. nitrogen, oxygen or xenon, into substrate 12. The material may be any type of material that has a sufficiently high activation energy so the material will not become activated during subsequent thermal annealling, i.e. the step that activates other doped regions, e.g. source and drain regions 16 and 18. The material may be implanted by any type of implantation device used in conventional implantation processes, e.g. the Varian E220 manufactured by Varian Corp. of Palo Alto, Calif. Additional benefits of the present invention can be obtained by implanting Nitrogen ions as opposed to Oxygen ions because implantation of Oxygen ions may encourage undesirable Oxygen-enhanced diffusion in substrate 12. Typically, implantation of inert ions can be done at approximately 10–100 kiloelectron Volts (keV).

Photoresist layer 50 preferably prevents most or all of the material being implanted from entering portions of substrate 12 that photoresist layer 50 covers. Selected locations 58, 60, however, receive the material at bottom surfaces 66, 68 of trenches 62, 64. The material is implanted into substrate 12 below or nearby trenches 62, 64 with a relatively high dose, e.g. more than $1 \times 10^{16}$ dopants per $cm^2$. The dosage of material implanted need only be sufficient to provide necessary electrical isolation between doped regions 16, 18 and doped regions 30, 32. Preferably, implanted portions 42, 44 extend below subsequently fabricated well region 28 (See FIG. 1), i.e. about 0.2 to 0.25 microns deep. The depth of implanted portions 42, 44 may vary depending upon the specific application of the present invention. Likewise, the depth of insulative portions 38, 40 will also depend upon the specific application of the present invention, but generally may be reduced in the present invention to one-half or even one-third of the depth of well region 28.

Referring again to FIG. 1, additional steps in the fabrication process of the present invention are shown. An insulative material is deposited in trenches 62, 64 to form insulative portions 38, 40. The insulative material may be applied to trenches 62, 64 by any of various deposition techniques, e.g. CVD or PVD. Preferably, the insulative material is planarized until upper surfaces 72, 74 are substantially coplanar with the upper surface 46 of doped regions 16, 18. Coplanarity between isolation structures 34, 36 and upper surfaces 72, 74 allows uniformity in subsequent fabrication steps. In an alternative embodiment, doped regions 16, 18 may have upper surfaces of different heights, or insulative portions 38, 40 may be planarized to be coplanar with other layers deposited above upper surface 46.

Well region 28 may be formed, e.g. by providing an implant or dopant to the substrate. Doped regions 16, 18 may be fabricated by applying one or more dosages of dopant to regions 16, 18, of either a P-type dopant or an N-type dopant, e.g. boron, phosphorous, arsenic, indium, boron diflouride, etc. A subsequent thermal annealing step will function to activate the dopants applied in these regions. Additionally, gate stack 20 may be fabricated according to known methods. Insulative portion 24 may be a selected portion of insulative layer 48 (FIG. 2) or may be fabricated separately.

Accordingly, it can be seen that package density of an integrated circuit utilizing the method of the present invention can be greatly improved by reducing the width of standard STI structures by reducing the depth of the structure and implanting a material beneath the structures to maintain the electrical isolation properties. It can also been seen that a nitride layer may be utilized to selectively implant the material only at selected locations, and not at the remainder of the substrate, thereby preventing any unwanted impact of the implantation process on devices on the substrate.

It is understood that, while the detailed drawings and specific examples given describe preferred exemplary embodiments of the present invention, they are for the purpose of illustration only. The present invention is not limited to the precise details, methods, materials, and conditions disclosed. For example, although specific depths of trenches 62, 64 and implanted portions 42, 44 have been specified, the demands of other devices may dictate depths other than those specified herein. Further, the concentration of material implanted in portions 42, 44 may also vary depending upon the specific application of the present invention. The various layers, contacts, cells, and transistors may have different geometry depending on integrated circuit designs and process technologies. Accordingly, the present invention is not to be limited to any specific embodiment herein, but rather is to extend to all embodiments now known or later developed that fall within the spirit and scope of the present invention as defined by the claims appended hereinafter.

What is claimed is:

1. An integrated circuit on a substrate having an improved packing density, the integrated circuit comprising a plurality of devices on the substrate, each device having a substantially uniformly doped well region adjacent the device, each well region having a depth, wherein the substrate has a shallow trench between two of the devices, the shallow trench having an insulative material, a portion of the substrate adjacent the trench having an implanted material comprising an inert ion selected from the group consisting of a nitrogen ions, oxygen ions, and xenon ions, wherein the shallow trench has a depth smaller than the depth of the well regions of the devices.

2. The integrated circuit of claim 1, wherein the implanted material is an inert ion selected from the group consisting of nitrogen ions and oxygen ions.

3. The integrated circuit of claim 2, wherein the devices are MOSFETS.

4. The integrated circuit of claim 3, the devices having doped regions, the doped regions having a depth, the trench having a depth larger than the depth of the doped regions.

5. The integrated circuit of claim 4, wherein the devices are in a CMOS configuration.

6. The integrated circuit of claim 5, wherein the insulative material substantially fills the trench.

7. The integrated circuit of claim 1, wherein the depth of the trench is less than 0.1 microns.

8. The integrated circuit of claim 1, wherein the width of the trench is less than 0.06 microns.

9. A shallow trench isolation structure located between two devices on an integrated circuit, comprising:
    an insulative material between the two devices, the insulative material having a depth smaller than the depth of substantially uniformly-doped wells associated with and adjacent to the two devices; and
    an implantation region adjacent to the insulative material, the implantation region extending below the depth of the wells associated with and adjacent to the two devices, wherein the implantation region includes a material having a higher activation energy than a doped region adjacent the shallow trench isolation structure.

10. The structure of claim 9, wherein the depth of the insulative material is less than 0.1 microns.

11. The structure of claim 10, wherein the two devices are transistors having source and drain doped regions.

12. The structure of claim 11, wherein the implantation region is implanted with material selected from the group consisting of nitrogen ions and oxygen ions.

13. The structure of claim 11, wherein the insulative material is substantially coplanar with the top surface of the substrate.

14. The structure of claim 11, wherein the width of the structure is less than 0.06 microns.

15. An integrated circuit on a substrate having an improved packing density, the integrated circuit comprising a plurality of devices on the substrate, wherein the substrate has a trench between two of the devices, the trench having an insulative material, a portion of the substrate below the trench having an implanted material selected from the group consisting of nitrogen ions, oxygen ions, and xenon ions.

16. The integrated circuit of claim 15, each device having a well region, each well region having a depth, wherein the trench has a depth smaller than the depth of the well regions of the devices.

17. The integrated circuit of claim 16, wherein the implanted inert ions extend below the depth of the well regions of the devices.

18. The integrated circuit of claim 15, wherein the implanted inert ions are selected from the group consisting of nitrogen ions and oxygen ions.

19. The integrated circuit of claim 15, wherein the devices are MOSFETS.

20. The integrated circuit of claim 15, wherein the devices have doped regions, the doped regions having a depth, the trench having a depth larger than the depth of the doped regions.

21. The integrated circuit of claim 15, wherein the insulative material substantially fills the trench.

22. The integrated circuit of claim 15, wherein the insulative material includes an oxide material.

23. The integrated circuit of claim 20, wherein the implanted inert ions have an activation energy higher than that of the doped regions.

* * * * *